(12) United States Patent
Godo

(10) Patent No.: US 8,704,267 B2
(45) Date of Patent: Apr. 22, 2014

(54) LIGHT-EMITTING DISPLAY DEVICE

(75) Inventor: Hiromichi Godo, Isehara (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 216 days.

(21) Appl. No.: 12/579,486

(22) Filed: Oct. 15, 2009

(65) Prior Publication Data
US 2010/0096654 A1 Apr. 22, 2010

(30) Foreign Application Priority Data
Oct. 16, 2008 (JP) .................. 2008-267681

(51) Int. Cl.
*H01L 33/00* (2010.01)
(52) U.S. Cl.
USPC ............ 257/103; 257/E33.001; 257/79
(58) Field of Classification Search
USPC .............. 257/40, 79–103, 347, E33.001
See application file for complete search history.

(56) References Cited

U.S. PATENT DOCUMENTS

| | | |
|---|---|---|
| 5,384,517 A | 1/1995 | Uno |
| 5,731,856 A | 3/1998 | Kim et al. |
| 5,744,864 A | 4/1998 | Cillessen et al. |
| 5,847,410 A | 12/1998 | Nakajima |
| 6,194,740 B1 | 2/2001 | Zhang et al. |
| 6,294,274 B1 | 9/2001 | Kawazoe et al. |
| 6,563,174 B2 | 5/2003 | Kawasaki et al. |
| 6,586,346 B1 | 7/2003 | Yamazaki et al. |
| 6,720,572 B1 * | 4/2004 | Jackson et al. ............... 257/40 |
| 6,727,522 B1 | 4/2004 | Kawasaki et al. |
| 6,924,503 B2 | 8/2005 | Cheng et al. |
| 6,960,812 B2 | 11/2005 | Yamazaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |

(Continued)

FOREIGN PATENT DOCUMENTS

| | | |
|---|---|---|
| EP | 1443130 A | 8/2004 |
| EP | 1737044 A | 12/2006 |

(Continued)

OTHER PUBLICATIONS

Dembo.H et al., "RFCPUS on Glass and Plastic Substrates Fabricated by TFT Transfer Technology,", IEDM 05: Technical Digest of International Electron Devices Meeting, Dec. 5, 2005, pp. 1067-1069.

(Continued)

*Primary Examiner* — Tucker Wright
(74) *Attorney, Agent, or Firm* — Eric J. Robinson; Robinson Intellectual Property Law Office, P.C.

(57) ABSTRACT

The light-emitting display device comprises first and second thin film transistors. The first thin film transistor includes a first gate electrode; a first oxide semiconductor film; and a first electrode and a second electrode which are electrically connected to the first oxide semiconductor film. The second thin film transistor includes a second gate electrode electrically connected to the second electrode; a second oxide semiconductor film; a third electrode; a light-emitting layer and a fourth electrode over the second oxide semiconductor film. A work function of the second oxide semiconductor film is higher than a work function of the fourth electrode.

17 Claims, 9 Drawing Sheets

(56) References Cited

U.S. PATENT DOCUMENTS

| | | |
|---|---|---|
| 7,297,977 B2 | 11/2007 | Hoffman et al. |
| 7,301,211 B2 | 11/2007 | Yamazaki et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,560,735 B2 | 7/2009 | Furukawa et al. |
| 7,674,650 B2 | 3/2010 | Akimoto et al. |
| 7,732,819 B2 | 6/2010 | Akimoto et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0206332 A1* | 11/2003 | Yamazaki et al. ............ 359/312 |
| 2003/0207500 A1* | 11/2003 | Pichler et al. ............... 438/127 |
| 2003/0218222 A1 | 11/2003 | Wager et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0039670 A1* | 2/2005 | Hosono et al. .................. 117/2 |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0103290 A1 | 5/2006 | Suh et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1* | 6/2006 | Sano et al. ..................... 257/59 |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0072439 A1 | 3/2007 | Akimoto et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0215945 A1 | 9/2007 | Tokunaga et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0128705 A1* | 6/2008 | Ishiguro ........................ 257/72 |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0203387 A1 | 8/2008 | Kang et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0291350 A1 | 11/2008 | Hayashi et al. |
| 2008/0296568 A1 | 12/2008 | Ryu et al. |
| 2008/0308796 A1 | 12/2008 | Akimoto et al. |
| 2008/0308797 A1 | 12/2008 | Akimoto et al. |
| 2008/0308804 A1 | 12/2008 | Akimoto et al. |
| 2008/0308805 A1 | 12/2008 | Akimoto et al. |
| 2008/0308806 A1 | 12/2008 | Akimoto et al. |
| 2009/0008639 A1 | 1/2009 | Akimoto et al. |
| 2009/0065771 A1 | 3/2009 | Iwasaki et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0025678 A1 | 2/2010 | Yamazaki et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |

FOREIGN PATENT DOCUMENTS

| | | |
|---|---|---|
| EP | 2226847 A | 9/2010 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 03-231472 A | 10/1991 |
| JP | 04-368795 A | 12/1992 |
| JP | 05-041285 A | 2/1993 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2003-229616 A | 8/2003 |
| JP | 2003-282256 A | 10/2003 |
| JP | 2004-087458 A | 3/2004 |
| JP | 2004-103957 A | 4/2004 |
| JP | 2004-273614 A | 9/2004 |
| JP | 2004-273732 A | 9/2004 |
| JP | 2006-098542 A | 4/2006 |
| JP | 2006-148097 | 6/2006 |
| JP | 2006-324655 | 11/2006 |
| JP | 2007-096055 | 4/2007 |
| JP | 2007-123861 | 5/2007 |
| JP | 2007-250983 A | 9/2007 |
| JP | 2008-176262 A | 7/2008 |
| JP | 2008-216529 A | 9/2008 |
| JP | 2008-235871 A | 10/2008 |
| JP | 2008-281988 A | 11/2008 |
| WO | WO-2004/114391 | 12/2004 |
| WO | WO-2007/119386 | 10/2007 |
| WO | WO-2008/105347 | 9/2008 |
| WO | WO-2008/126879 | 10/2008 |

OTHER PUBLICATIONS

Ikeda.T et al., "Full-Functional System Liquid Crystal Display Using CG-Silicon Technology,", SID Digest '04 : SID International Symposium Digest of Technical Papers, 2004, vol. 35, pp. 860-863.

(56) References Cited

OTHER PUBLICATIONS

Nomura.K et al., "Room-Temperature Fabrication of Transparent Flexible Thin-Film Transistors Using Amorphous Oxide Semiconductors,", Nature, Nov. 25, 2004, vol. 432, pp. 488-492.

Takahashi.M et al., "Theoretical Analysis of IGZO Transparent Amorphous Oxide Semiconductor,", IDW '08 : Proceedings of the 15th International Display Workshops, Dec. 3, 2008, pp. 1637-1640.

Prins.M et al., "A Ferroelectric Transparent Thin-Film Transistor,", Appl. Phys. Lett. (Applied Physics Letters), Jun. 17, 1996, vol. 68, No. 25, pp. 3650-3652.

Nakamura.M et al., "The phase relations in the $In_2O_3$—$Ga_2ZnO_4$—ZnO system at 1350° C.,", Journal of Solid State Chemistry, Aug. 1, 1991, vol. 93, No. 2, pp. 298-315.

Kimizuka.N. et al., "Syntheses and Single-Crystal Data of Homologous Compounds, $In_2O_3(ZnO)_m$ (m=3, 4, and 5), $InGaO_3(ZnO)_3$, and $Ga_2O_3(ZnO)_m$ (m=7, 8, 9, and 16) in the $In_2O_3$—$ZnGa_2O_4$—ZnO System,", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor,", Science, May 23, 2003, vol. 300, No. 5623, pp. 1269-1272.

Osada.T et al., "15.2: Development of Driver-Integrated Panel using Amorphous In—Ga—Oxide TFT,", SID Digest '09 : SID International Symposium Digest of Technical Papers, May 31, 2009, pp. 184-187.

Li.C et al., "Modulated Structures of Homologous Compounds $InMO_3(ZnO)_m$ (M=In,Ga; m=Integer) Described by Four-Dimensional Superspace Group,", Journal of Solid State Chemistry, 1998, vol. 139, pp. 347-355.

Lee.J et al., "World3 s Largest (15-Inch) XGA AMLCD Panel Using IGZO Oxide TFT,", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDs,", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing $MoO_3$ as a Charge-Generation Layer,", Adv. Mater. (Advanced Materials), 2006, vol. 18, No. 3, pp. 339-342.

Tsuda.K et al., "Ultra Low Power Consumption Technologies for Mobile TFT-LCDs ,", IDW '02 : Proceedings of the 9th Internatioinal Display Workshops, Dec. 4, 2002, pp. 295-298.

Jeong.J et al., "3.1: Distinguished Paper: 12.1-Inch WXGA AMOLED Display Driven by Indium-Gallium-Zinc Oxide TFTs Array,", SID Digest '08 : SID International Symposium Digest of Technical Papers, May 20, 2008, vol. 39, No. 1, pp. 1-4.

Kurokawa.Y et al., "UHF RFCPUS on Flexible and Glass Substrates for Secure RFID Systems,", Journal of Solid-State Circuits , 2008, vol. 43, No. 1, pp. 292-299.

Ohara.H et al., "Amorphous In—Ga—Zn—Oxide TFTs with Suppressed Variation for 4.0 inch QVGA Amoled Display,", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue Phase",", Physics Letters, Sep. 10, 1973, vol. 45A, No. 2, pp. 115-116.

Cho.D et al., "21.2:AL and SN-Doped Zinc Indium Oxide Thin Film Transistors for Amoled Back-Plane,", SID Digest '09 : SID International Symposium Digest of Technical Papers, May 31, 2009, pp. 280-283.

Lee.M et al., "15.4:Excellent Performance of Indium-Oxide-Based Thin-Film Transistors by DC Sputtering,", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and Its Bending Properties,", SID Digest '09 : SID International Symposium Digest of Technical Papers, May 31, 2009, pp. 983-985.

Sakata.J et al., "Development of 4.0-In. AMOLED Display With Driver Circuit Using Amorphous In—Ga—Zn—Oxide TFTS,", IDW '09 : Proceedings of the 16th International Display Workshops, 2009, pp. 689-692.

Park.J et al., "Amorphous Indium—Gallium—Zinc Oxide TFTS and Their Application for Large Size AMOLED,", AM-FPD '08 Digest of Technical Papers, Jul. 2, 2008, pp. 275-277.

Park.S et al., "Challenge to Future Displays: Transparent AM-OLED Driven by Peald Grown ZnO TFT,", IMID '07 Digest, 2007, pp. 1249-1252.

Godo.H et al., "Temperature Dependence of Characteristics and Electronic Structure for Amorphous In—Ga—Zn—Oxide TFT,", AM-FPD '09 Digest of Technical Papers, Jul. 1, 2009, pp. 41-44.

Osada.T et al., "Development of Driver-Integrated Panel Using Amorphous In—Ga—Zn—Oxide TFT,", AM-FPD '09 Digest of Technical Papers, Jul. 1, 2009, pp. 33-36.

Hirao.T et al., "Novel Top-Gate Zinc Oxide Thin-Film Transistors (ZnO TFTS) for AMLCDS,", Journal of the SID, 2007, vol. 15, No. 1, pp. 17-22.

Hosono.H, "68.3:Invited Paper:Transparent Amorphous Oxide Semiconductors for High Performance TFT,", SID Digest '07 :SID International Symposium Digest of Technical Papers, 2007, vol. 38, pp. 1830-1833.

Godo.H et al., "P-9:Numerical Analysis on Temperature Dependence of Characteristics of Amorphous In—Ga—Zn—Oxide TFT,", SID Digest '09 : SID International Symposium Digest of Technical Papers, May 31, 2009, pp. 1110-1112.

Ohara.H et al., "21.3:4.0 In. QVGA Amoled Display Using In—Ga—Zn—Oxide TFTS With a Novel Passivation Layer,", SID Digest 3 09 : SID International Symposium Digest of Technical Papers, May 31, 2009, pp. 284-287.

Miyasaka.M, "58.2 Invited Paper: SUFTLA Flexible Microelectronics on Their Way to Business,", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors,", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications,", SID International Symposium Digest of Technical Papers, May 31, 2009, pp. 578-581.

Asaoka.Y et al., "29.1:Polarizer-Free Reflective LCD Combined With Ultra Low-Power Driving Technology,", SID Digest '09 : SID International Symposium Digest of Technical Papers, May 31, 2009, pp. 395-398.

Lee.H et al., "Current Status of, Challenges to, and Perspective View of AM-OLED ,", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application,", SID Digest '07 : SID International Symposium Digest of Technical Papers, 2007, vol. 38, pp. 1737-1740.

Kikuchi.H et al., "Polymer-Stabilized Liquid Crystal Blue Phases,", Nature Materials, Sep. 2, 2002, vol. 1, pp. 64-68.

Kimizuka.N. et al., "Spinel,$YbFe_2O_4$, and $Yb_2Fe_3O_7$ Types of Structures for Compounds in the $In_2O_3$ and $Sc_2O_3$—$A_2O_3$—BO Systems [A; Fe, Ga, or Al; B: Mg, Mn, Fe, Ni, Cu,or Zn] at Temperatures Over 1000° C.,", Journal of Solid State Chemistry, 1985, vol. 60, pp. 382-384.

Kitzerow.H et al., "Observation of Blue Phases in Chiral Networks,", Liquid Crystals, 1993, vol. 14, No. 3, pp. 911-916.

Costello.M et al., "Electron Microscopy of a Cholesteric Liquid Crystal and Its Blue Phase,", Phys. Rev. A (Physical Review. A), May 1, 1984, vol. 29, No. 5, pp. 2957-2959.

Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.

International Search Report (Application No. PCT/JP2009/067956) Dated Jan. 26, 2010.

Written Opinion (Application No. PCT/JP2009/067956) Dated Jan. 26, 2010.

(56) References Cited

OTHER PUBLICATIONS

Park, J. et al., "Amorphous Indium—Gallium—Zinc Oxide TFTS and Their Application for Large Size AMOLED," AM-FPD '08 Digest of Technical Papers, Jul. 2, 2008, pp. 275-278.

Fortunato.E et al., "Wide-Bandgap High-Mobility ZnO Thin-Film Transistors Produced at Room Temperature,", Appl. Phys. Lett. (Applied Physics Letters), Sep. 27, 2004, vol. 85, No. 13, pp. 2541-2543.

Park.J et al., "Improvements in the Device Characteristics of Amorphous Indium Gallium Zinc Oxide Thin-Film Transistors by Ar Plasma Treatment,", Appl. Phys. Lett. (Applied Physics Letters), Jun. 26, 2007, vol. 90, No. 26, pp. 262106-1-262106-3.

Hayashi.R et al., "42.1: Invited Paper: Improved Amorphous In—Ga—Zn—O TFTS,", SID Digest '08 : SID International Symposium Digest of Technical Papers, May 20, 2008, vol. 39, pp. 621-624.

Masuda.S et al., "Transparent thin film transistors using ZnO as an active channel layer and their electrical properties,", J. Appl. Phys. (Journal of Applied Physics), Feb. 1, 2003, vol. 93, No. 3, pp. 1624-1630.

Asakuma.N. et al., "Crystallization and Reduction of Sol-Gel-Derived Zinc Oxide Films by Irradiation With Ultraviolet Lamp,", Journal of Sol-Gel Science and Technology, 2003, vol. 26, pp. 181-184.

Nomura.K et al., "Carrier transport in transparent oxide semiconductor with intrinsic structural randomness probed using single-crystalline InG2O3(ZnO)5 films,", Appl. Phys. Lett. (Applied Physics Letters) Sep. 13, 2004, vol. 85, No. 11, pp. 1993-1995.

Son.K et al., "42.4L: Late-News Paper: 4 Inch QVGA AMOLED Driven by the Threshold Voltage Controlled Amorphous GIZO (Ga2O3—In2O3—ZnO) TFT,", SID Digest '08 : SID International Symposium Digest of Technical Papers, May 20, 2008, vol. 39, pp. 633-636.

Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.

Fung.T at al., "2-D Numerical Simulation of High Performance Amorphous In—Ga—Zn—O TFTs for Flat Panel Displays,", AM-FPD '08 Digest of Technical Papers, Jul. 2, 2008, pp. 251-252, The Japan Society of Applied Physics.

Park.J et al., "High performance amorphous oxide thin film transistors with self-aligned top-gate structure,", IEDM 3 09: Technical Digest of International Electron Devices Meeting, Dec. 7, 2009, pp. 191-194.

Nakamura.M, "Synthesis of Homologous Compound with New Long-Period Structure,", NIRIM Newsletter, Mar. 1, 1995, vol. 150, pp. 1-4.

Park.Sang-Hee et al., "42.3: Transparent ZnO Thin Film Transistor for the Application of High Aperture Ratio Bottom Emission AM-OLED Display,", SID Digest '08 : SID International Symposium Digest of Technical Papers, May 20, 2008, vol. 39, pp. 629-632.

Orita.M et al., "Mechanism of Electrical Conductivity of Transparent InGaZnO4,", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors,", Jpn. J. Appl. Phys. (Japanese Journal of Applied Physics), 2006, vol. 45, No. 5B, pp. 4303-4308.

Janotti.A et al., "Native Point Defects in ZnO,", Phys. Rev. B (Physical Review. B), Oct. 4, 2007, vol. 76, No. 16, pp. 165202-1-165202-22.

Park.J et al., "Electronic Transport Properties of Amorphous Indium—Gallium—Zinc Oxide Semiconductor Upon Exposure to Water,", Appl. Phys. Lett. (Applied Physics Letters), 2008, vol. 92, pp. 072104-1-072104-3.

Hsieh.H et al., "P-29:Modeling of Amorphous Oxide Semiconductor Thin Film Transistors and Subgap Density of States,", SID Digest '08 : SID International Symposium Digest of Technical Papers, 2008, vol. 39, pp. 1277-1280.

Janotti.A et al., "Oxygen Vacancies in ZnO,", Appl. Phys. Lett. (Applied Physics Letters), 2005, vol. 87, pp. 122102-1-122102-3.

Oba.F at al., "Defect energetics in ZnO: A hybrid Hartree-Fock density functional study,", Phys. Rev. B (Physical Review. B), 2008, vol. 77, pp. 245202-1-245202-6.

Orita.M et al., "Amorphous transparent conductive oxide InGaO3(ZnO)m (m<4):a Zn4s conductor,", Philosophical Magazine, 2001, vol. 81, No. 5, pp. 501-515.

Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.

Mo.Y et al., "Amorphous Oxide TFT Backplanes for Large Size Amoled Displays,", IDW '08 : Proceedings of the 6th International Display Workshops, Dec. 3, 2008, pp. 581-584.

Kim.S et al., "High-Performance oxide thin film transistors passivated by various gas plasmas,", 214th ECS Meeting, 2008, No. 2317, ECS.

Clark.S et al., "First Principles Methods Using CASTEP,", Zeitschrift fur Kristallographie, 2005, vol. 220, pp. 567-570.

Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers,", J. Electrochem. Soc. (Journal of the Electrochemical Society), 2008, vol. 155, No, 12, pp. H1009-H1014.

Ueno.K et al., "Field-Effect Transistor on SrTiO3 With Sputtered Al2O3 Gate Insulator,", Appl. Phys. Lett. (Applied Physics Letters), Sep. 1, 2003, vol. 83, No. 9, pp. 1755-1757.

Otani.S et al., "Fabrication of Organic Light Emitting Transistor Using Thin-Film ZnO,", IEICE Technical Report, Jun. 17, 2005, vol. 105, No. 141, pp. 11-14, IEICE(The Institute of Electronics, Information and Communication Engineers).

\* cited by examiner

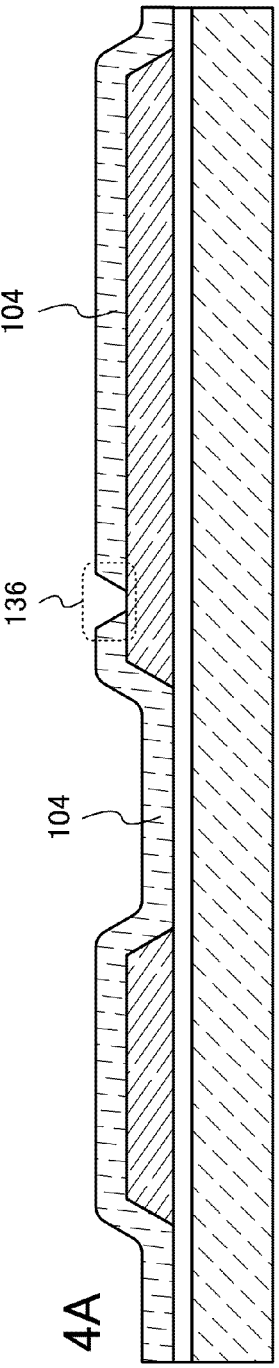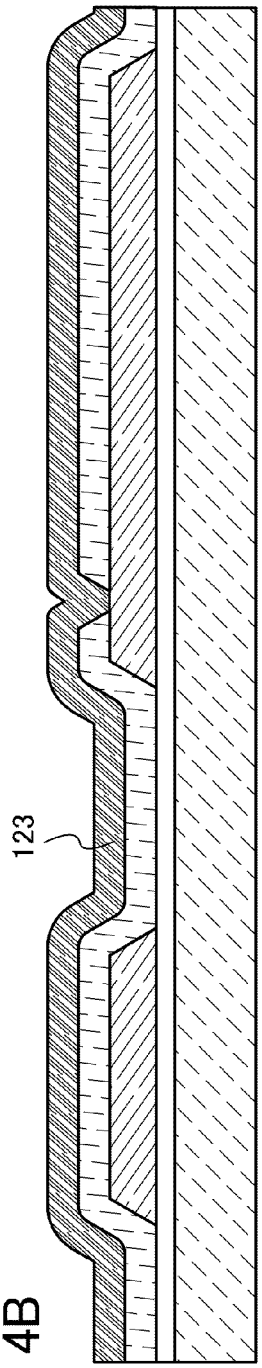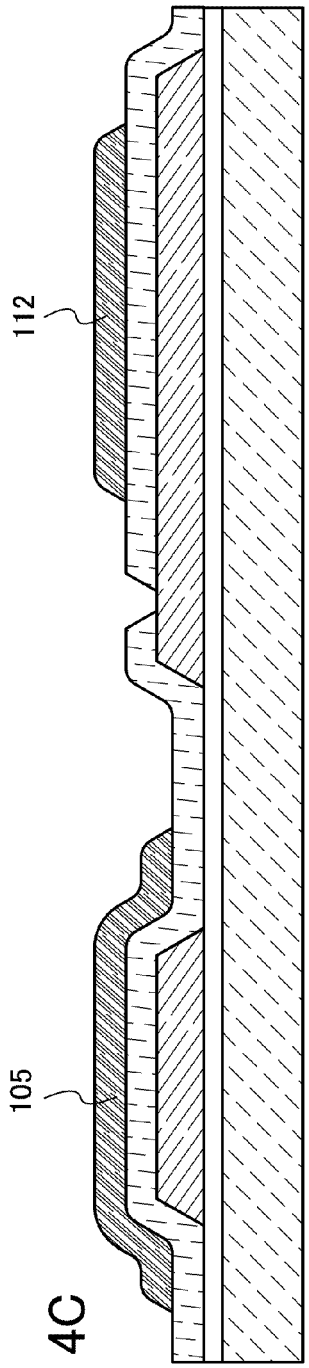

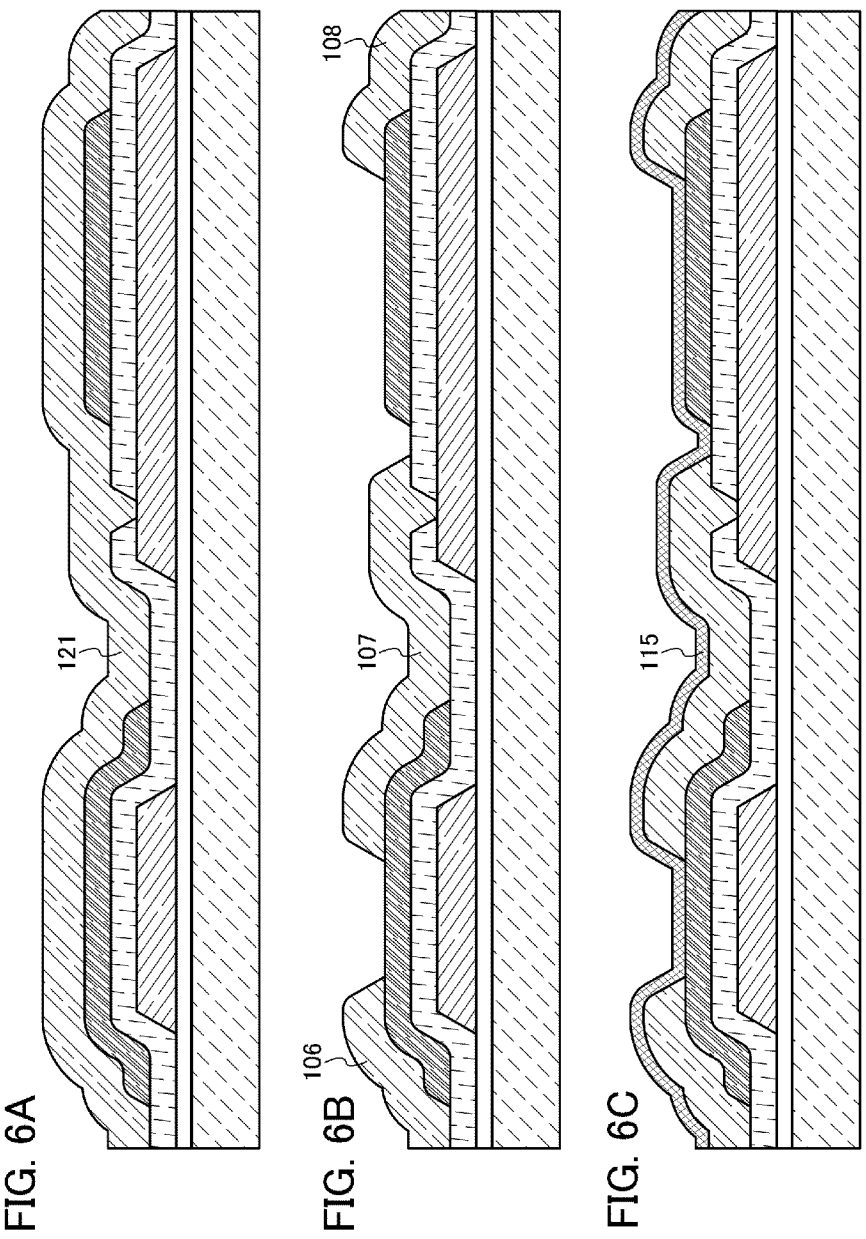

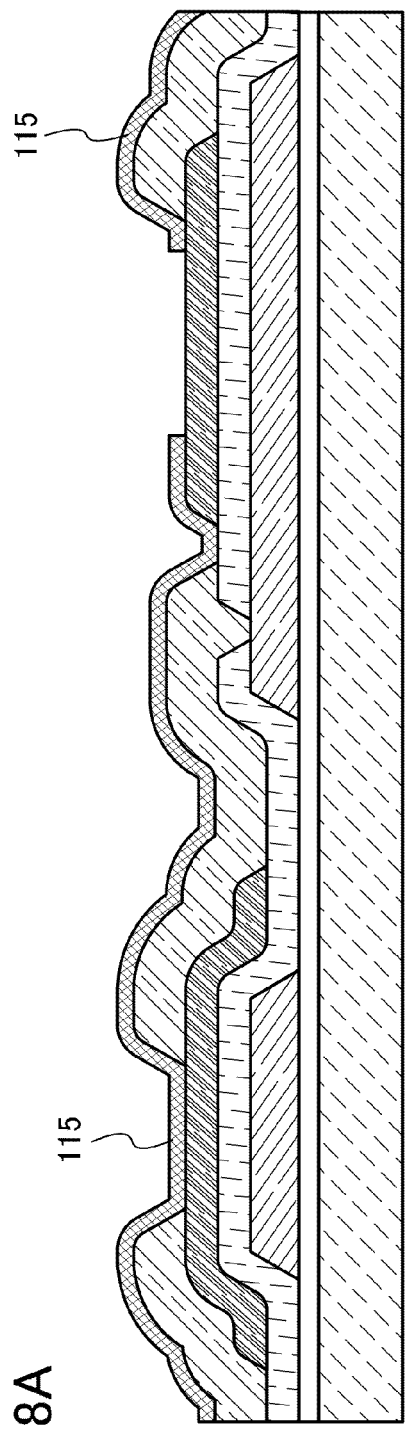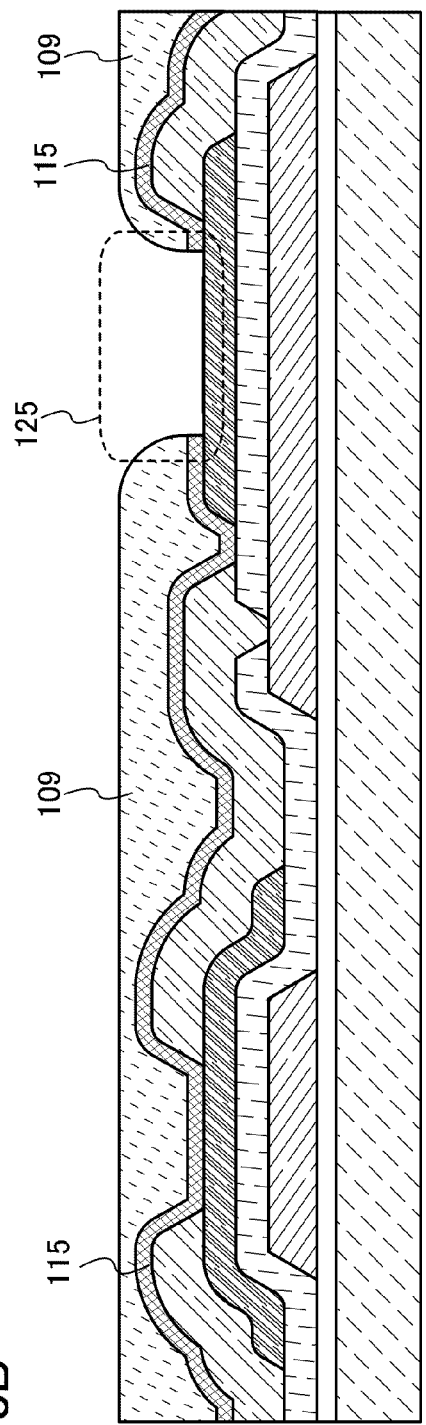

LIGHT-EMITTING DISPLAY DEVICE

BACKGROUND OF THE INVENTION

1. Field of the Invention

The present invention in this specification relates to a light-emitting display device in which an oxide semiconductor is used and a method for manufacturing the light-emitting display device.

2. Description of the Related Art

It has been promoted to develop light-emitting elements where electrons are injected from one electrode and holes are injected from the other electrode into a stacked body containing an organic compound sandwiched between the pair of electrodes and the electrons and holes are recombined in the stacked body so that a light-emitting material in the stacked body is excited and thus light emission can be obtained. Further, development of light-emitting devices and display devices using the light-emitting elements has been also promoted.

Being self-light-emitting type ones, such light-emitting elements are superior in visibility with low dependence on a viewing angle, and thin shape and weight saving can be realized easily. Therefore, such light-emitting elements are expected to be applied to the use of flat panel displays of the next generation. In addition, it is also possible to manufacture such elements in a flexible film such as plastic, the elements are expected to be used for mobile displays.

A light-emitting display device using this light-emitting element can be roughly divided into two types, that is, a passive matrix type and an active matrix type. In the active matrix light-emitting display device, a thin film transistor (TFT) is electrically connected to each pixel to control light emission of a light-emitting element.

Thus far, an inorganic semiconductor material typified by silicon has been widely used for a TFT of the active matrix light-emitting display device. However, high temperature treatment is needed in order to form the inorganic semiconductor material typified by silicon as a semiconductor layer; therefore, it is difficult to use a flexible material such as plastic or a film as a substrate.

On the other hand, a TFT in which an organic semiconductor material is used as a semiconductor layer can be formed even at relatively low temperature; therefore, it is possible to manufacture in principle a TFT not only over a glass substrate but also over a substrate having low heat resistance such as plastic.

However, TFTs using organic semiconductor materials as semiconductor layers have disadvantages of low reliability and low mobility (see Patent Document 1).

On the other hand, TFTs whose active layers are formed using oxide semiconductors have high electric field mobility. Oxide semiconductor films can be formed at a temperature of 300° C. or lower by a sputtering method or the like, and a manufacturing process of the oxide semiconductor films is easy.

For example, a technique is known, by which a TFT is formed using zinc oxide or an In—Ga—Zn—O-based oxide semiconductor as an oxide semiconductor film and such a transistor is used as a switching element or the like of an image display device (see Patent Documents 2 and 3).

REFERENCE

[Patent Document 1] Japanese Published Patent Application No. 2006-324655

[Patent Document 2] Japanese Published Patent Application No. 2007-123861

[Patent Document 3] Japanese Published Patent Application No. 2007-096055

SUMMARY OF THE INVENTION

As for a light-emitting display device in which a TFT including an oxide semiconductor film, which has high electric field mobility, and a light-emitting element in which light emission is obtained by recombination of electrons and holes in a stacked body, are formed over one substrate, the number of masks is increased in the manufacturing process of such a light-emitting display device, which leads to increase of the number of manufacturing steps and the manufacturing cost.

In view of the above-described problem, it is an object to provide a light-emitting display device including a TFT having an oxide semiconductor film, which has high reliability and high mobility, with the reduced number of masks used in manufacturing the light-emitting display device.

Oxide semiconductor films are used for an active layer of a switching transistor and an active layer of a light-emitting transistor in a light-emitting display device. Thus, a TFT which has high reliability and high mobility can be obtained, and thus driving speed of the whole light-emitting display device can be improved.

Further, the active layer of the light-emitting transistor also serves as a pixel electrode, and thus the increase of the number of masks can be suppressed.

One embodiment of the present invention is a light-emitting display device comprising a first thin film transistor and a second thin film transistor. The first thin film transistor includes a first gate electrode; a gate insulating film covering the first gate electrode; a first oxide semiconductor film as a first active layer, which is provided over the gate insulating film; and a first electrode and a second electrode which are electrically connected to the first oxide semiconductor film. The second thin film transistor includes a second gate electrode electrically connected to the second electrode; the gate insulating film covering the second gate electrode; a second oxide semiconductor film as a second active layer, which is provided over the gate insulating film; a third electrode electrically connected to the second oxide semiconductor film; a light-emitting layer over the second oxide semiconductor film; and a fourth electrode over the light-emitting layer. A work function of the second oxide semiconductor film is higher than a work function of the fourth electrode, and the first oxide semiconductor film and the second oxide semiconductor film are each represented by $InMO_3(ZnO)_m$ (m>0), and each include, as the M, one or more metal elements of gallium (Ga), iron (Fe), nickel (Ni), manganese (Mg), and cobalt (Co).

The light-emitting layer includes a light-emitting layer and at least one of a hole-injecting layer, a hole-transporting layer, an electron-transporting layer, and an electron-injecting layer.

The second gate electrode comprises a conductive film having a light-blocking property, and the fourth electrode comprises a conductive film having a light-transmitting property.

The second gate electrode comprises a conductive film having a light-transmitting property, and the fourth electrode comprises a conductive film having a light-blocking property.

The second gate electrode comprises a conductive film having a light-transmitting property, and the fourth electrode comprises a conductive film having a light-transmitting property.

A light-emitting transistor which has high reliability and high mobility can be formed.

Further, an active layer of a switching transistor and a pixel electrode can be formed using the same mask, which leads to reduction of the number of masks.

Furthermore, in a light-emitting element according to one embodiment of the present invention disclosed below, an active layer of a light-emitting transistor serves as one of electrodes between which a light-emitting layer is formed, and thus the amount of materials used for the electrodes can be reduced.

BRIEF DESCRIPTION OF THE DRAWINGS

In the accompanying drawings:

FIGS. 4A to 4C are cross-sectional views illustrating a manufacturing process of the light-emitting display device;

FIGS. 6A to 6C are cross-sectional views illustrating a manufacturing process of the light-emitting display device;

FIGS. 8A and 8B are cross-sectional views illustrating a manufacturing process of the light-emitting display device.

DETAILED DESCRIPTION OF THE INVENTION

Figure 1:
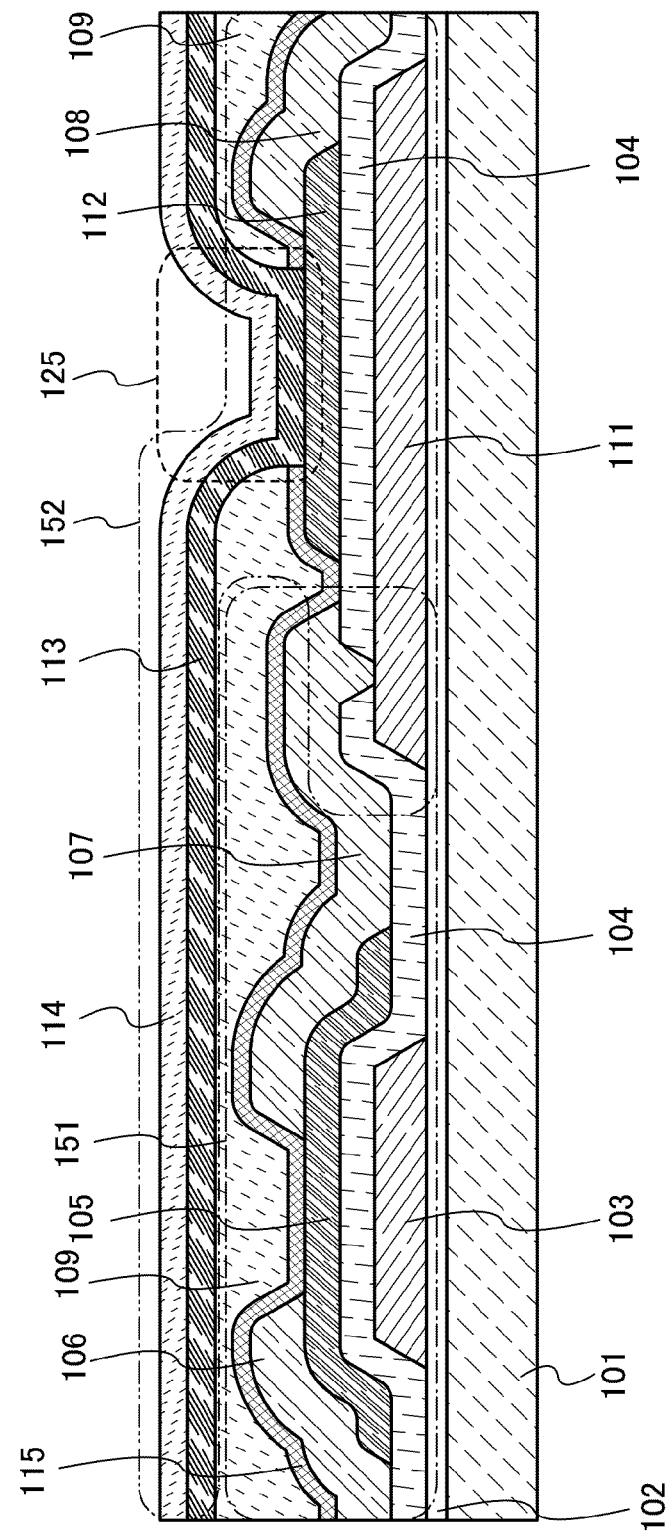
FIG. 1 is a cross-sectional view of a light-emitting display device.

Embodiments of the present invention disclosed in this specification will be hereinafter described with reference to the accompanying drawings. The present invention can be carried out in many different modes. It is easily understood by those skilled in the art that modes and details disclosed herein can be modified in various ways without departing from the spirit and the scope of the present invention. Therefore, the present invention is not construed as being limited to the description of the embodiments. It is to be noted that like portions or portions having the same function in the accompanying drawings are denoted by the same reference numerals, and repeated descriptions thereof will be omitted.

Note that in this specification, the term "semiconductor device" refers to elements or devices in general which can function by utilizing semiconductor characteristics, and include electric devices including electric circuits, liquid crystal display devices, light-emitting devices, and the like, and electronic devices on which such electric devices are mounted.

Embodiment 1

Embodiment 1 will now be described with reference to FIG. 1, FIG. 2, FIGS. 3A to 3C, FIGS. 4A to 4C, FIGS. 5A to 5C, FIGS. 6A to 6C, FIGS. 7A and 7B, FIGS. 8A and 8B, and FIG. 9.

Figure 3A:
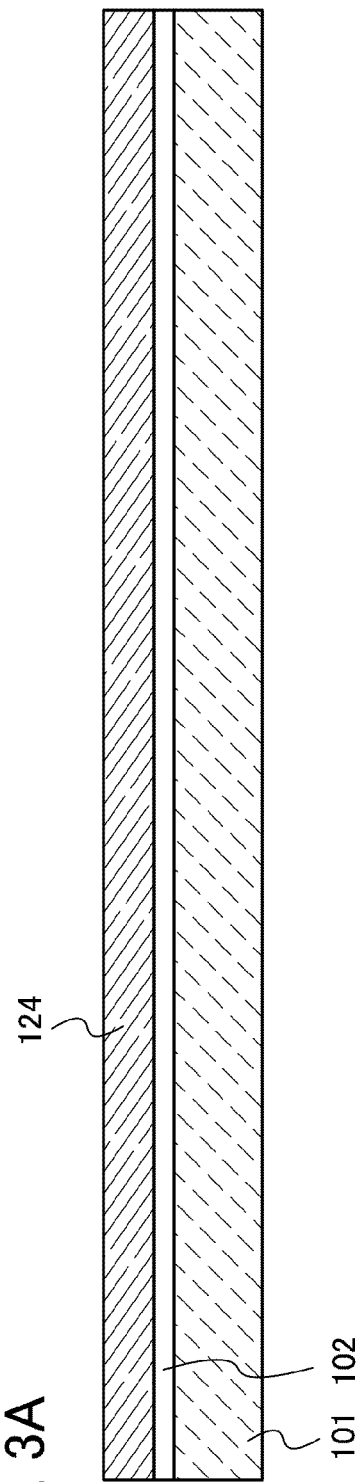
FIGS. 3A to 3C are cross-sectional views illustrating a manufacturing process of the light-emitting display device.

A base film 102 and a conductive film 124 are formed first over a substrate 101 (FIG. 3A).

In FIG. 3A, as the substrate 101, it is possible to use a glass substrate made of barium borosilicate glass, aluminoborosilicate glass, or the like typified by 7059 glass, 1737 glass, or the like manufactured by Corning Incorporated.

For the base film 102, a silicon oxide film, a silicon nitride oxide film, a silicon nitride film, or a silicon oxynitride film may be used. In addition, an insulating film 104 is formed later, and thus the base film 102 is not necessarily formed, if not needed. In this embodiment, a silicon oxide film is used as the base film 102.

The conductive film 124 is preferably formed using a conductive material having low resistance, such as aluminum (Al) or copper (Cu). However, since use of Al alone brings disadvantages such as low heat resistance and a tendency to be corroded, aluminum is used in combination with a conductive material having heat resistance, when such a conductive material having low resistance is used.

As the conductive material having heat resistance, any of the following materials may be used: an element selected from titanium (Ti), tantalum (Ta), tungsten (W), molybdenum (Mo), chromium (Cr), neodymium (Nd), and scandium (Sc), an alloy containing any of these elements as a component, an alloy containing some of these elements in combination, and a nitride containing any of these elements as a component.

The conductive film 124 may be a stacked layer of a combination of a conductive material having low resistance and a conductive material having heat resistance, a single layer of a conductive material having heat resistance, or a stacked layer of different conductive materials having heat resistance.

Figure 3B:
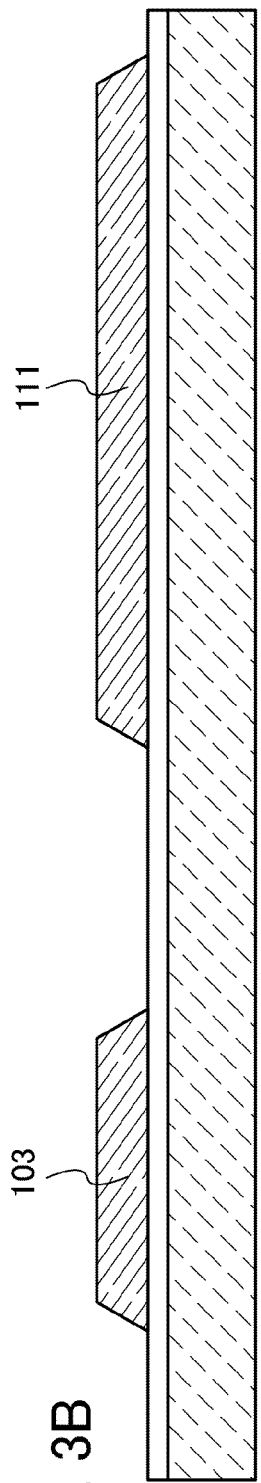

After the conductive film 124 is entirely formed over the substrate 101, a resist mask is formed and an unnecessary portion is removed by etching to form an electrode 103 to serve as a gate electrode of a TFT 151 and an electrode 111 to serve as a gate electrode of a TFT 152 (FIG. 3B).

Figure 3C:
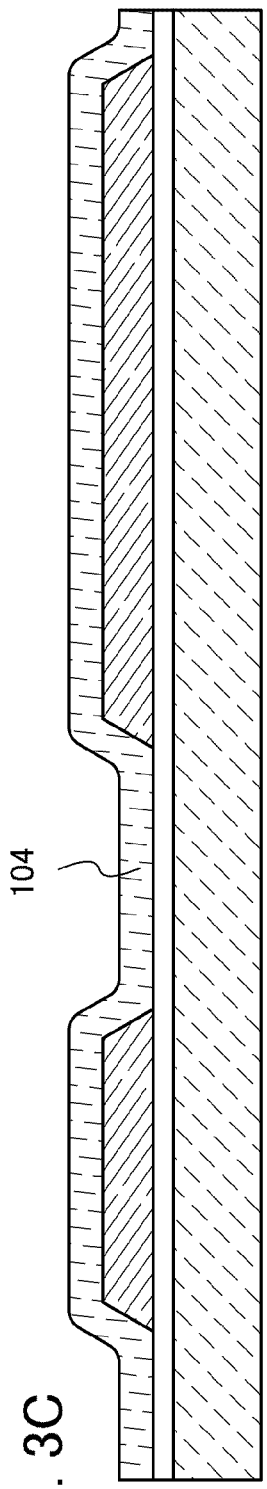

Then, an insulating film 104 to serve as a gate insulating film is formed so as to cover the electrode 103, the electrode 111, and the base film 102 or the substrate 101 when the base film 102 is not formed (FIG. 3C).

The insulating film 104 may have a single layer structure or a stacked layer structure of insulating materials such as a silicon oxide film, a silicon oxynitride film, a silicon nitride film, a silicon nitride oxide film, an aluminum oxide film, a tantalum oxide film, and/or another insulating material. In this embodiment, a silicon oxide film is used as the insulating film 104.

Then, a contact hole 136 is formed in the insulating film 104 by etching or the like (FIG. 4A). Note that the contact hole 136 may be formed after an oxide semiconductor film 105 and an oxide semiconductor film 112 to be described later are formed. A process in that case will be described later with reference to FIGS. 5A to 5C.

After the state of FIG. 4A is obtained, an oxide semiconductor film 123 is formed so as to cover the insulating film 104 and the electrode 111 exposed in the contact hole 136 (FIG. 4B).

Note that preferably, before the formation of the oxide semiconductor film 123, dust attached to a surface of the insulating film 104 is removed by reverse sputtering in which an argon gas is introduced to generate plasma. Note that nitrogen, helium, or the like may be used instead of the argon atmosphere. Alternatively, an argon atmosphere to which oxygen, hydrogen, $N_2O$, and/or the like is added may be used. Further alternatively, an argon atmosphere to which $Cl_2$, $CF_4$, and/or the like is added may be used.

It is effective to form the oxide semiconductor film 123 (In—Ga—Zn—O-based non-single-crystal film in this embodiment) without being exposed to air after the plasma treatment is conducted to the insulating film 104, because dust or moisture is not attached to the interface between the insulating film 104 and the oxide semiconductor film 123.

The oxide semiconductor film 123 used in this specification is a thin film expressed by $InMO_3(ZnO)_m$ (m>0). Note that M denotes one metal element or a plurality of metal elements selected from gallium (Ga), iron (Fe), nickel (Ni), manganese (Mn), and cobalt (Co). For example, M denotes Ga in some cases; meanwhile, M includes the above metal element such as Ni or Fe in addition to Ga (i.e., Ga and Ni or Ga and Fe) in other cases. Further, the above oxide semiconductor film 123 may contain Fe or Ni, another transitional metal element, or an oxide of a transitional metal as an impurity element in addition to the metal element contained as M. In this specification, this thin film is also referred to as an In—Ga—Zn—O-based non-single-crystal film.

Table 1 shows a typical measurement example of obtained by inductively coupled plasma mass spectrometry (ICP-MS). An oxide semiconductor film of $InGa_{0.95}Zn_{0.41}O_{3.33}$ is obtained as the oxide semiconductor film 123 under Condition 1 where a target in which the ratio of $In_2O_3$ to $Ga_2O_3$ and ZnO is 1:1:1 (the ratio of In to Ga and Zn being 1:1:0.5) is used and the flow rate of an argon gas in a sputtering method is 40 sccm. In addition, an oxide semiconductor film of $InGa_{0.94}Zn_{0.40}O_{3.31}$ is obtained as the oxide semiconductor film 123 under Condition 2 where the flow rates of an argon gas and oxygen in a sputtering method are 10 sccm and 5 sccm, respectively.

TABLE 1

| Flow rates | Composition (atomic %) | | | | |
|---|---|---|---|---|---|
| $Ar/O_2$ | In | Ga | Zn | O | Compositional formula |
| 40/0 | 17.6 | 16.7 | 7.2 | 58.6 | $InGa_{0.95}Zn_{0.41}O_{3.33}$ |
| 10/5 | 17.7 | 16.7 | 7 | 58.6 | $InGa_{0.94}Zn_{0.40}O_{3.31}$ |

Further, Table 2 shows results quantified by Rutherford backscattering spectrometry (RBS) instead of ICP-MS.

TABLE 2

| Flow rates | Composition (atomic %) | | | | | |
|---|---|---|---|---|---|---|
| $Ar/O_2$ | In | Ga | Zn | O | Ar | Compositional formula |
| 40/0 | 17 | 15.8 | 7.5 | 59.4 | 0.3 | $InGa_{0.93}Zn_{0.44}O_{3.49}$ |
| 10/5 | 16 | 14.7 | 7.2 | 61.7 | 0.4 | $InGa_{0.92}Zn_{0.45}O_{3.86}$ |

According to the results of the measurement of the sample in Condition 1 by RBS, the oxide semiconductor film 123 is $InGa_{0.93}Zn_{0.44}O_{3.49}$. In addition, according to the results of the measurement of the sample in Condition 2 by RBS, the oxide semiconductor film 123 is $InGa_{0.92}Zn_{0.45}O_{3.86}$.

An amorphous structure is observed as a crystal structure in the In—Ga—Zn—O-based non-single-crystal film by X-ray diffraction (XRD). In that case, heat treatment is performed on the In—Ga—Zn—O-based non-single-crystal film at 200 to 500° C., typically 300 to 400° C., for 10 minutes to 100 minutes after the film is formed by a sputtering method. In addition, a thin film transistor having electric characteristics such as an on/off ratio of $10^9$ or more and a mobility of 10 ($cm^2/Vs$) or more at a gate voltage of ±20 V can be formed.

In this embodiment, the oxide semiconductor film 123 is formed using an oxide semiconductor target including In, Ga, and Zn ($In_2O_3:Ga_2O_3:ZnO=1:1:1$) with a diameter of 8 inches, with the distance between the substrate 101 and the target of 170 mm, a pressure of 0.4 Pa, and a direct current (DC) power source of 0.5 kW, and in an argon atmosphere or an oxygen atmosphere. Note that it is preferable to use a pulsed direct-current (DC) power source with which dust can be reduced and thickness distribution can be uniform. The thickness of the oxide semiconductor film 123 may be 5 nm to 200 nm In this embodiment, the thickness of the oxide semiconductor film 123 is 100 nm.

Examples of a sputtering method include an RF sputtering method in which a high-frequency power source is used as a sputtering power source, a DC sputtering method, and a pulsed DC sputtering method in which a bias is applied in a pulsed manner. An RF sputtering method is mainly used in a case where an insulating film is formed, and a DC sputtering method is mainly used in a case where a metal film is formed.

In addition, there is also a multi-source sputtering apparatus in which a plurality of targets of different materials can be set. With the multi-source sputtering apparatus, films of different materials can be formed to be stacked in the same chamber, or plural kinds of materials can be deposited by electric discharge at the same time in the same chamber.

In addition, there are a sputtering apparatus provided with a magnet system inside a chamber and used for a magnetron sputtering, and a sputtering apparatus used for an ECR sputtering in which plasma generated with use of microwaves is used without using glow discharge.

Furthermore, as a deposition method by sputtering, there are also a reactive sputtering method by which a target substance and a sputtering gas component are chemically reacted with each other during deposition to form a thin compound film, and a bias sputtering by which a voltage is applied to also a substrate during deposition.

At this time, when zinc oxide (ZnO) is used as the oxide semiconductor film 123, zinc oxide has difficulty in reducing a carrier density, which might cause increase of the conductivity unfortunately. In a case where an active layer of a TFT is formed using the oxide semiconductor film 123 and a light-emitting display device is manufactured using the TFT, off current of the TFT cannot be decreased and thus changeover of emission or non emission by on/off switching is difficult. In other words, there is a concern that such a light-emitting display device emits light continuously.

Next, a resist mask is formed and the oxide semiconductor film 123 is etched. At this time, wet etching is conducted using ITO-07N (manufactured by KANTO CHEMICAL CO., INC.), and the oxide semiconductor film 105 serving as the active layer of the TFT 151 and the oxide semiconductor film 112 serving as the active layer of the TFT 152 are formed from the oxide semiconductor film 123 (FIG. 4C). The etching at this time may be dry etching without being limited to wet etching.

Figure 5A:
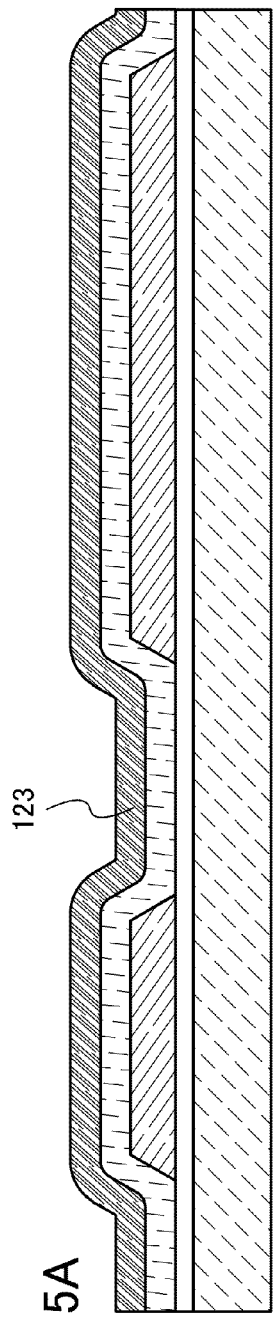
FIGS. 5A to 5C are cross-sectional views illustrating a manufacturing process of the light-emitting display device.

Alternatively, the state of FIG. 3C is obtained, and then the oxide semiconductor film 123 may be formed over the insulating film 104 without formation of the contact hole 136 (FIG. 5A).

Figure 5B:
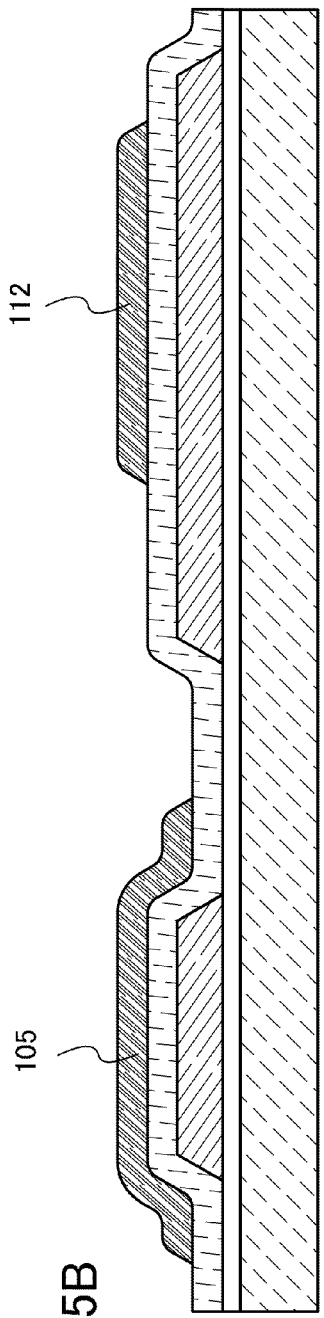

Then, similar to FIG. 4C, the oxide semiconductor film 123 is etched to form the oxide semiconductor film 105 and the oxide semiconductor film 112 (FIG. 5B).

Figure 5C:
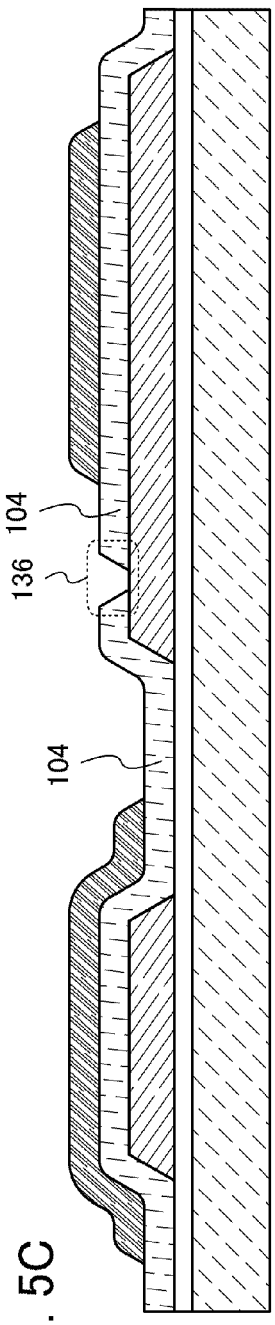

Then, the insulating film 104 is etched to form the contact hole 136 (FIG. 5C). Note that the state of FIG. 4C is the same as the state of FIG. 5C.

Next, a conductive film 121 formed of a metal material is formed over the oxide semiconductor film 105 and the oxide semiconductor film 112 by a sputtering method or a vacuum evaporation method (FIG. 6A).

As the material of the conductive film 121, there is an element selected from Al, Cr, Ta, Ti, Mo, and W, an alloy containing any of these elements as a component, an alloy containing some of these elements in combination, and the like. Further, when heat treatment is conducted at 200 to 600° C., the conductive film preferably has heat resistance high enough to withstand the heat treatment. Since use of Al alone brings disadvantages such as low heat resistance and a tendency to be corroded, aluminum is used in combination with a conductive material having heat resistance. As the conductive material having heat resistance which is used in combination with Al, any of the following materials may be used: an element selected from titanium (Ti), tantalum (Ta), tungsten (W), molybdenum (Mo), chromium (Cr), neodymium (Nd), and scandium (Sc), an alloy containing any of these above elements as a component, an alloy containing some of these elements in combination, and a nitride containing any of these above elements as a component.

Then, a resist mask is provided over the conductive film 121, and the conductive film 121 is etched to form a wiring 106, a wiring 107 and a wiring 108 (FIG. 6B).

The wiring 106 serves as a source electrode of the TFT 151 and the wiring 107 serves as a drain wiring (or drain electrode) of the TFT 151 and is electrically connected to the electrode 111 which is the gate electrode of the TFT 152. In addition, the wiring 108 serves as a source wiring of the TFT 152.

Then, a protective film 115 is formed so as to cover the wiring 106, the wiring 107, the oxide semiconductor film 105, and the oxide semiconductor film 112 (FIG. 6C). In this embodiment, a silicon nitride film is used as the protective film 115.

Next, heat treatment is preferably performed at 200 to 600° C., typically, 300 to 500° C. Here, heat treatment is performed in a nitrogen atmosphere in a furnace at 350° C. for 1 hour. Through this heat treatment, rearrangement at the atomic level occurs in the oxide semiconductor film 105 and the oxide semiconductor film 112. Because strain energy which inhibits carrier movement is released by the heat treatment, the heat treatment (including optical annealing) is important. There is no particular limitation on timing of the heat treatment as long as it is conducted after the formation of the oxide semiconductor film 123.

Figure 7A:
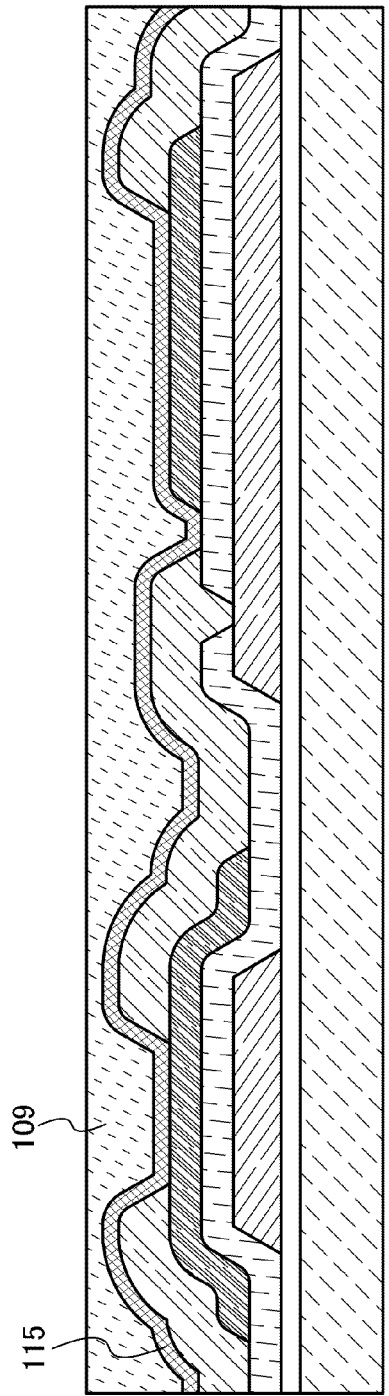
FIGS. 7A and 7B are cross-sectional views illustrating a manufacturing process of the light-emitting display device.
Figure 7B:
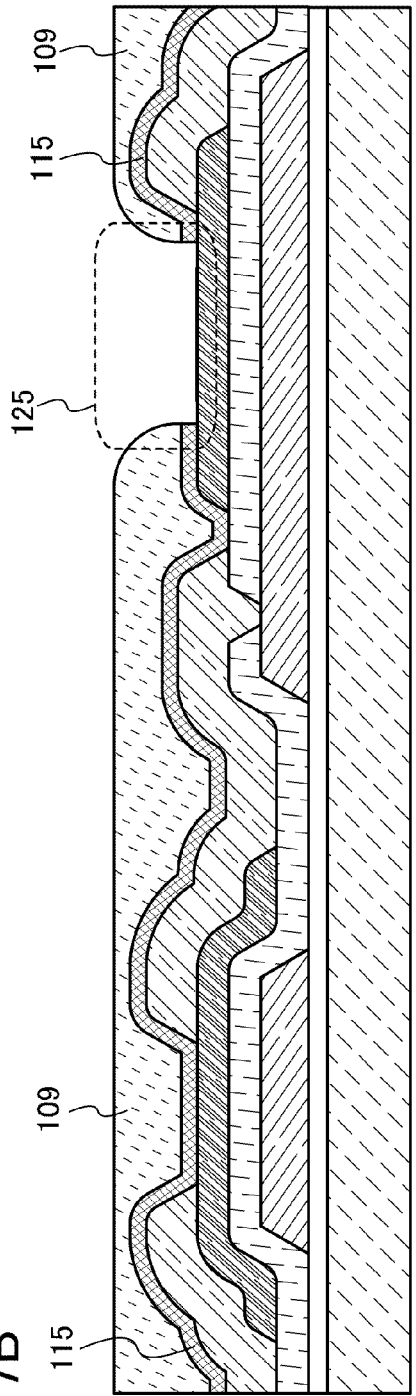

Then, an insulator 109 is formed over the protective film 115 (FIG. 7A), and part of the protective film 115 and part of the insulator 109 which are over the oxide semiconductor film 112 are removed to form an opening portion 125, so that part of the oxide semiconductor film 112 is exposed (FIG. 7B).

Alternatively, it is also possible that after the state of FIG. 6A is obtained, part of the protective film 115 over the oxide semiconductor film 112 is removed to expose part of the oxide semiconductor film 112 (FIG. 8A), then the insulator 109 is formed over a region other than the exposed oxide semiconductor film 112, and thus the opening portion 125 is formed.

The insulator 109 is formed using an organic resin film, an inorganic insulating film, or organic polysiloxane. Preferably, the insulator 109 is formed using a photosensitive material and the opening portion 125 is formed over the oxide semiconductor film 112 so that a sidewall of the opening portion is formed as a tilted surface with continuous curvature.

Next, a light-emitting layer 113 and an electrode 114 are formed over the insulator 109 serving as a partition and the exposed oxide semiconductor film 112 (FIG. 1).

The light-emitting layer 113 may be formed to have a single layer structure or a stacked layer structure including a plurality of layers. When the light-emitting layer has a plurality of layers, a hole-injecting layer, a hole-transporting layer, a light-emitting layer, an electron-transporting layer, and an electron-injecting layer may be formed in this order from the side on which the wiring 108 serving as an anode and the oxide semiconductor film 112 are formed to the side on which the electrode 114 serving as a cathode is formed. Alternatively, from the side on which the wiring 108 serving as an anode and the oxide semiconductor film 112 are formed to the side on which the electrode 114 serving as a cathode is formed, the light-emitting layer and at least one of the hole-injecting layer, the hole-transporting layer, the electron-transporting layer, and the electron-injecting layer may be stacked. Note that the "light-emitting layer 113" indicates a single light-emitting layer or a stacked layer of a light-emitting layer and at least one of a hole-injecting layer, a hole-transporting layer, an electron-transporting layer, and an electron-injecting layer.

An In—Ga—Zn—O-based non-single-crystal film is used for the oxide semiconductor film 112 in this embodiment, and is suitable for the anode, because it has a high work function.

Figure 2:
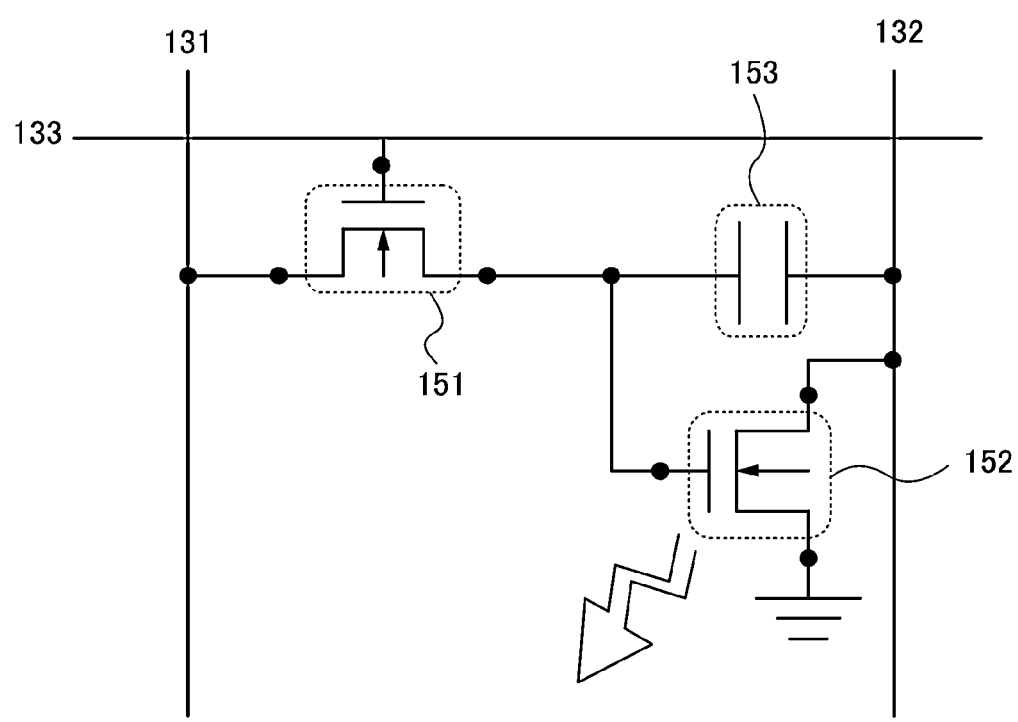
FIG. 2 is a circuit diagram of the light-emitting display device.
Figure 9:
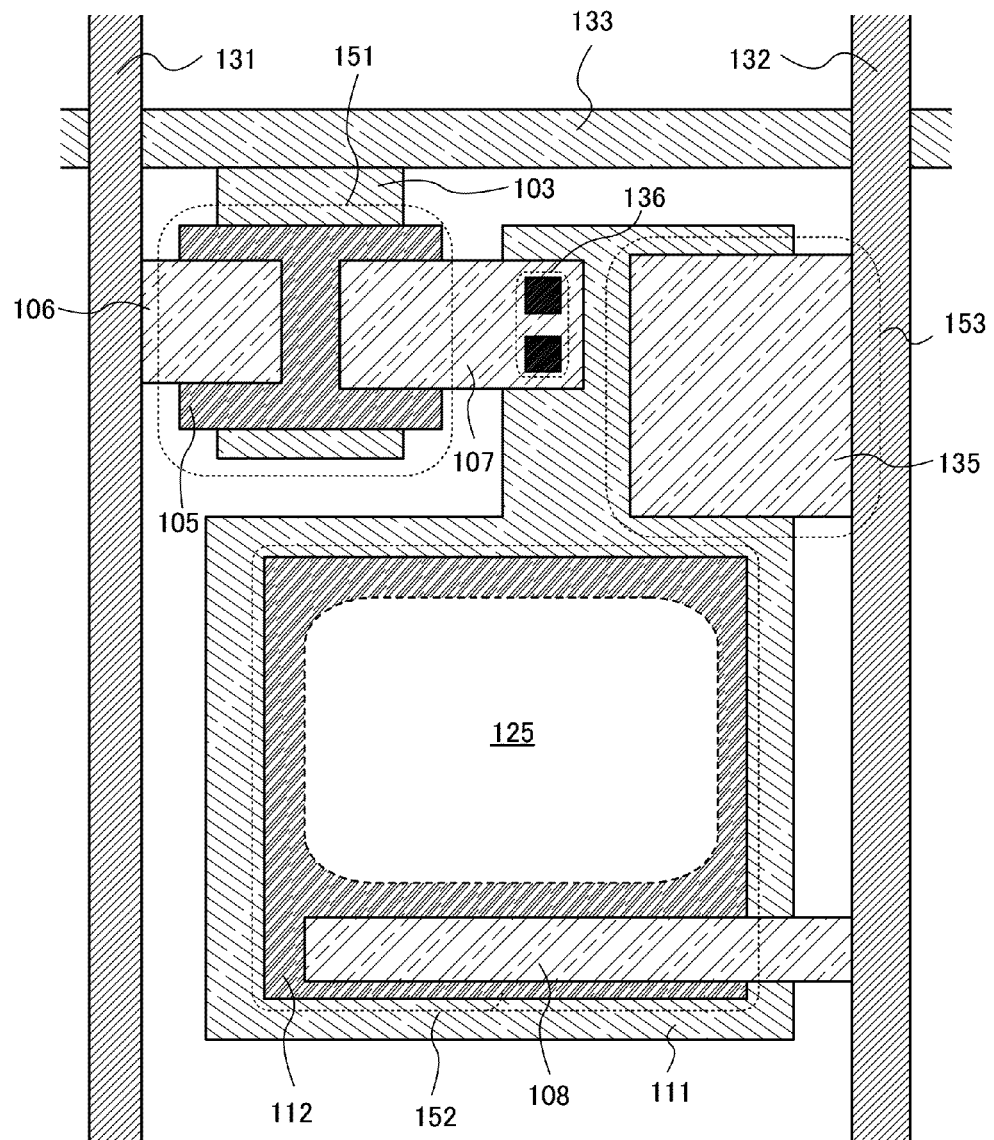
FIG. 9 is a top view of the light-emitting display device.

The electrode 114 serving as a cathode may be formed using a conductive film having a light-transmitting property, e.g., indium tin oxide (ITO). Alternatively, a conductive film having a light-emitting property and a conductive thin film having a low work function may be stacked such that light cannot be blocked by the stacked layer. Preferable examples of a conductive film having a low work function include conductive films including Ca, Al, CaF, MgAg, AlLi and the like, A cross-sectional view, a circuit diagram, and a top view of the thus formed light-emitting display device are illustrated in FIG. 1, FIG. 2, and FIG. 9, respectively.

The wiring 106 of the first TFT 151 serving as a switching transistor is electrically connected to the oxide semiconductor film 105 and a signal line 131, and the electrode 103 serving as the gate electrode of the TFT 151 is electrically connected to a scan line 133. Note that the electrode 103 and the scan line 133 may be formed using the same material and in the same manufacturing step, or the electrode 103 and the scan line 133 may be formed using different materials and in different manufacturing steps and then may be electrically connected to each other. The wiring 107 of the TFT 151 is electrically connected to the oxide semiconductor film 105 and the electrode 111 which is the gate electrode of the TFT 152.

The wiring 108 of the second TFT 152 serving as a light-emitting transistor is electrically connected to the oxide semiconductor film 112 and a Vdd line 132. The light-emitting layer 113 and the electrode 114 correspond to a drain electrode of the TFT 152.

A capacitor 153 includes the electrode 111, the electrode 135, and the insulating film 104 as dielectrics arranged between the electrode 111 and the electrode 135. The electrode 135 is formed using the same material and in the same manufacturing step of the wiring 106, the wiring 107, and the wiring 108. In addition, the electrode 135 is electrically connected to the Vdd line 132.

The light-emitting display device having the above-described structure is a so-called top emission type light-emitting display device, in which light is emitted from the light-emitting layer 113 to the side opposite to the substrate 101.

On the other hand, the electrode 111 is formed using a conductive film having a light-transmitting property, and the electrode 114 is formed using a conductive film having a light-blocking property, whereby a so-called bottom emission type light-emitting display device can be obtained, in which light is emitted from the light-emitting layer 113 through the substrate 101.

Further, the electrode 111 is formed using a conductive film having a light-transmitting property, and the electrode 114 is formed using a conductive film having a light-transmitting property, whereby a so-called dual emission type light-emitting display device can be obtained, in which light is emitted from the light-emitting layer 113 through both the substrate 101 and the side opposite to the substrate 101.

Further, it is also possible that a conductive thin film having a low work function is stacked over the oxide semiconductor film 112 such that light cannot be blocked, and the conductive thin film serves as a cathode. In addition, the light-emitting layer 113 may have a structure in which an electron-injecting layer, an electron-transporting layer, a light-emitting layer, a hole-transporting layer, a hole-injecting layer, and the electrode 114 serving as an anode may be stacked in this order. Further, as described above, by using a conductive film having a light-transmitting property or a conductive film having a light-blocking property for the electrode 111 or the electrode 114, a bottom emission type light-emitting display device or a dual emission type light-emitting display device may be manufactured.

This application is based on Japanese Patent Application serial no. 2008-267681 filed with Japanese Patent Office on Oct. 16, 2008, the entire contents of which are hereby incorporated by reference.

What is claimed is:

1. A light-emitting display device comprising:
a first gate electrode and a second gate electrode;
a gate insulating film over the first gate electrode and the second gate electrode, wherein the gate insulating film has a contact hole over the second gate electrode;
a first oxide semiconductor film over the first gate electrode with the gate insulating film interposed therebetween;
a first electrode and a second electrode on and in direct contact with the first oxide semiconductor film, wherein the second electrode is on and in direct contact with the second gate electrode through the contact hole;
a second oxide semiconductor film over the second gate electrode with the gate insulating film interposed therebetween;
a third electrode electrically connected to the second oxide semiconductor film;
a protective film over and in contact with the first electrode, the second electrode, the third electrode, the first oxide semiconductor film, and the second oxide semiconductor film;
a light-emitting layer on and in direct contact with the second oxide semiconductor film; and
a fourth electrode over the light-emitting layer.

2. The light-emitting display device according to claim 1, wherein a work function of the second oxide semiconductor film is higher than a work function of the fourth electrode.

3. The light-emitting display device according to claim 1, wherein the first oxide semiconductor film and the second oxide semiconductor film are each represented by $InMO_3(ZnO)_m$ (m>0), and each include, as the M, one or more metal elements of gallium (Ga), iron (Fe), nickel (Ni), manganese (Mg), and cobalt (Co).

4. The light-emitting display device according to claim 1, wherein the second gate electrode comprises a conductive film having a light-blocking property, and the fourth electrode comprises a conductive film having a light-transmitting property.

5. The light-emitting display device according to claim 1, wherein the second gate electrode comprises a conductive film having a light-transmitting property, and the fourth electrode comprises a conductive film having a light-blocking property.

6. The light-emitting display device according to claim 1, wherein the second gate electrode comprises a conductive film having a light-transmitting property, and the fourth electrode comprises a conductive film having a light-transmitting property.

7. A light-emitting display device comprising:
a first thin film transistor comprising:
a first gate electrode;
a gate insulating film over the first gate electrode;
a first oxide semiconductor film over the gate insulating film;
a first electrode and a second electrode on and in direct contact with the first oxide semiconductor film; and
a protective film over and in contact with the first electrode, the second electrode, and the first oxide semiconductor film; and
a second thin film transistor comprising:
a second gate electrode;
the gate insulating film over the second gate electrode;
a second oxide semiconductor film over the gate insulating film;
a third electrode electrically connected to the second oxide semiconductor film;
a light-emitting layer on and in direct contact with the second oxide semiconductor film;
a fourth electrode over the light-emitting layer; and
the protective film over and in contact with the third electrode and the second oxide semiconductor film,
wherein the gate insulating film has a contact hole over the second gate electrode, and
wherein the second electrode is on and in direct contact with the second gate electrode through the contact hole.

8. The light-emitting display device according to claim 7, wherein a work function of the second oxide semiconductor film is higher than a work function of the fourth electrode.

9. The light-emitting display device according to claim 7, wherein the first oxide semiconductor film and the second oxide semiconductor film are each represented by $InMO_3(ZnO)_m$ (m>0), and each include, as the M, one or more metal elements of gallium (Ga), iron (Fe), nickel (Ni), manganese (Mg), and cobalt (Co).

10. The light-emitting display device according to claim 7, wherein the second gate electrode comprises a conductive film having a light-blocking property, and the fourth electrode comprises a conductive film having a light-transmitting property.

11. The light-emitting display device according to claim 7, wherein the second gate electrode comprises a conductive film having a light-transmitting property, and the fourth electrode comprises a conductive film having a light-blocking property.

12. The light-emitting display device according to claim 7, wherein the second gate electrode comprises a conductive film having a light-transmitting property, and the fourth electrode comprises a conductive film having a light-transmitting property.

13. A light-emitting display device comprising a transistor and a light-emitting element,
wherein the transistor comprises:
a first electrode;
a first oxide semiconductor film over the first electrode with an insulating film interposed therebetween;
a first wiring and a second wiring on and in direct contact with the first oxide semiconductor film; and
a protective film over and in contact with the first wiring, the second wiring, and the first oxide semiconductor film, wherein the light-emitting element comprises:
- a second electrode;
- a second oxide semiconductor film over the second electrode with the insulating film interposed therebetween;
- a third wiring electrically connected to the second oxide semiconductor film;
- a light-emitting layer over the second oxide semiconductor film;
- a third electrode over the light-emitting layer; and
- the protective film over and in contact with the third wiring and the second oxide semiconductor film, wherein the insulating film has a contact hole over the second electrode, and wherein the second wiring is on and in direct contact with the second electrode through the contact hole.

14. The light-emitting display device according to claim 13, wherein a work function of the second oxide semiconductor film is higher than a work function of the second electrode.

15. The light-emitting display device according to claim 13, wherein the first oxide semiconductor film and the second oxide semiconductor film are represented by $InMO_3(ZnO)_m$ (m>0), and each include, as the M, one or more metal elements of gallium (Ga), iron (Fe), nickel (Ni), manganese (Mg), and cobalt (Co).

16. The light-emitting display device according to claim 13,
wherein each of the first electrode and the second electrode comprises a conductive film having a light-blocking property, and
wherein the third electrode comprises a conductive film having a light-transmitting property.

17. The light-emitting display device according to claim 13, wherein the light-emitting layer comprises one light emitting layer and at least one of a hole-injecting layer, a hole-transporting layer, an electron-transporting layer, and an electron-injecting layer.

* * * * *